United States Patent [19]

Segawa et al.

[11] Patent Number: 4,648,075

[45] Date of Patent: Mar. 3, 1987

[54] REDUNDANCY CIRCUIT FOR A SEMICONDUCTOR MEMORY DEVICE

[75] Inventors: Makoto Segawa; Shoji Ariizumi, both of Tokyo, Japan

[73] Assignee: Kabushiki Kaisha Toshiba, Japan

[21] Appl. No.: 669,361

[22] Filed: Nov. 8, 1984

[30] Foreign Application Priority Data

Nov. 9, 1983 [JP] Japan .................................. 58-210091

[51] Int. Cl.$^4$ ............................................. G11C 11/40
[52] U.S. Cl. ...................................... 365/200; 371/10
[58] Field of Search .................... 365/200, 210; 371/10

[56] References Cited

U.S. PATENT DOCUMENTS

| 4,047,163 | 9/1977 | Choate et al. ................... 371/10 X |
| 4,393,474 | 7/1983 | McElroy ............................. 365/200 |
| 4,459,685 | 7/1984 | Sud et al. ........................... 365/200 |

OTHER PUBLICATIONS

Y. H. Chan et al, "Array Word Redundancy Scheme", IBM Technical Disclosure Bulletin, vol. 25, No. 3A, Aug. 1982, pp. 989–992.

S. Konishi et al., "A 64 Kb CMOS RAM", ISSCC82, Feb. 12, 1982.

Japanese Patent Disclosure (KOKAI) No. 53-10228, Jan. 30, 1978.

Japanese Patent Disclosure (KOKAI) No. 53-41946, Apr. 15, 1978.

*Primary Examiner*—Joseph A. Popek
*Attorney, Agent, or Firm*—Finnegan, Henderson, Farabow, Garrett & Dunner

[57] ABSTRACT

A redundancy circuit for a semiconductor memory device of the byte configuration type, in which data is read out for each bit, is comprised of a main memory having a plurality of main memory cells arrayed in a matrix fashion, the matrix array being divided into memory sections in the column direction; a spare memory for saving defective memory cells contained in the main memory, the spare memory comprising spare rows of a plurality of spare memory cells arranged in the row direction, the spare row being provided for each of the main memory sections; programmable spare row decoders provided for each row of spare memory cells and for independently selecting each row of the spare memory cell; and main-decoder-disable signal-generating circuits provided for each of the memory sections and for placing all of the row main decoders of the corresponding memory section in non-select state in response to a signal derived from the programmed spare row decoder of the corresponding memory section.

2 Claims, 4 Drawing Figures

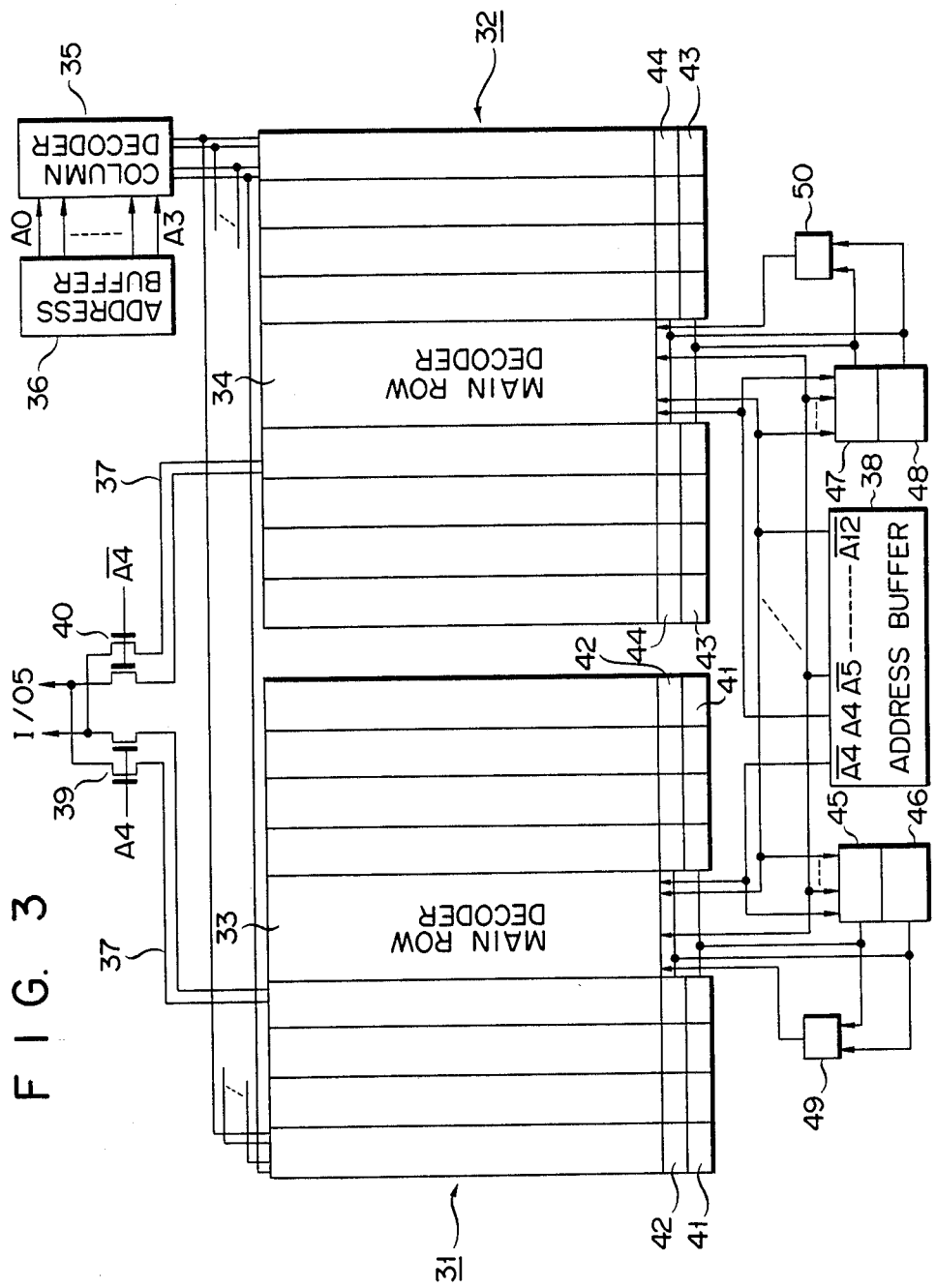
F I G. 3

REDUNDANCY CIRCUIT FOR A SEMICONDUCTOR MEMORY DEVICE

BACKGROUND OF THE INVENTION

This invention relates to a redundancy circuit for a semiconductor memory device and, more particularly, to a redundancy circuit for saving defective memory cells in a semiconductor memory device of the byte configuration type in which data are read out for each bit.

The integration density as well as the memory capacity of a semiconductor memory device has been increased year by year. Recently, 256 Kilo bits dynamic random access memories (DRAMs) and 64 Kilo bits static random access memories (SRAM) have been put into practice and widely marketed. In manufacturing such memory devices with high integration density and large memory capacity, the problem of the production yield is serious. To cope with this problem, a redundancy technique has been developed. In this approach, an auxiliary memory is formed on the same semiconductor chip with a main memory containing main memory cells in a predetermined memory capacity. If a defective memory cell is contained in the main memory, one of the spare memory cells is used in place of the defective cell. In this way, the production yield in manufacturing the semiconductor memory device is remarkably improved. Actually, however, it is impossible to replace the memory cells one by one. For this reason, in the conventional redundancy circuit, a proper number of row or column spare memory cells are provided. A row or column of the main memory array containing a defective memory cell is replaced by a row or a column in the spare memory arrays. To realize this, a spare row decoder or a spare column decoder associated with the spare memory is programmed so that when a defective cell contained row or column of the main memory is designated, a row or column of the spare memory is correspondingly designated. Fuses are used for program elements, and in programming the decoder, the fuses are selectively burned out by feeding current capable of melting the fuse or by applying a laser beam to the fuse.

FIG. 1 shows a conventional redundancy circuit with a program circuit in which fuses are selectively burned out in an electrical manner for the progamming. FIG. 2 shows the program circuit of the above redundancy circuit in which N channel MOS transistors are used for the programming elements. In FIG. 1, address signals Ao, $\overline{Ao}$ to An, $\overline{An}$ are applied to a main decoder 1 and program circuits $2_1$ to $2_n$. The output signals from the program elements $2_1$ to $2_n$, together with a spare row enable signal, are input to a spare row decoder 3. The output signal from the spare row decoder 3 is applied to a spare row 5 in a memory cell array 4. The output signal of the spare row decoder 3 is connected to a NOR gate 6. The output signal of the NOR gate 6 is inverted in level by an inverter 7 and is applied as a disable signal for the main decoder to the main decoder 1. The output signal of the main decoder 1 is input to a main row 8.

In FIG. 2, Ai and $\overline{Ai}$ designate address signals, respectively. MOS transistors 21-25 are of the enhancement type. MOS transistors 26 and 27 are of the depletion type. Reference numerals 28 and 29 stand for an inverter and a fuse, respectively. Address signals Ai and $\overline{Ai}$ are respectively connected to first ends of the current paths of the transistors 21 and 22. The second ends of these current paths are interconnected with each other to provide an output terminal of the redundancy circuit. The transistor 26 is connected at the drain to a programming power source Vp. The source of the transistor 26 is connected to the drains of the transistors 23 and 24 and the gate of the transistor 25. The gate of the transistor 26 is connected to the source thereof. A programming signal is applied to the gate of the transistor 23 of which the source is grounded. The address signal $\overline{Ai}$ is connected to the gate of the transistor 24 of which the source is grounded. The transistor 25 is grounded at the source and connected at the drain to one end of a fuse 29, the drain of the transistor 27, and the gate of the transistor 22. The drain of the transistor 25 is further connected through an inverter 28 to the gate of the transistor 21. The source of the transistor 27 is interconnected with the gate thereof, and further is grounded. The other end of the fuse 29 is connected to a power supply Vcc. The same thing is correspondingly applied to the other program circuits. In the example of FIG. 2, the fuse 29 is burned out by the program signal. With burning out the fuse 29, the address signal Ai or $\overline{Ai}$ is selected. When the fuse 29 is not melted, a Vcc potential (high level) is connected to the gate of the transistor 22 and the inverter 28 through the fuse 29. Then, the transistor 22 is turned on, while the transistor 21 is turned off by a low level output from the inverter 28. Accordingly, the address signal $\overline{Ai}$ is output to the output terminal 12 of the program circuit. On the other hand, when the fuse 29 is burned out, a low level potential is applied to the gate of the transistor 22 and the inverter 28. Then, the transistor 22 is turned off, and the transistor 21 is turned on since it receives a high level signal from the inverter 28. Accordingly, the address signal Ai is output.

For burning out the fuse 29, the programming signal is set at a low level, and the address signal $\overline{Ai}$ is also set at a low level. Then, the transistors 23 and 24 are both turned off. Accordingly, a high level potential is applied through the transistor 26 to the gate of the transistor 25. And the transistor 25 is turned on. As a result, a large current flows through the fuse 29, and then it is burned out.

In the redundancy circuit of FIG. 1, if the main memory has no defective memory cell, the spare row enable signal is kept at high level. Therefore, the output of the NOR gate 6 is high in level, and the output of the inverter 7 is low. Only the main decoder 1 operates to select a main row. When the main memory contains a defective memory cell, an address of the row containing the defective memory cell is selected and the fuse 29 is melted for programming. Further, the spare row enable signal is programmed to be in low level and to cause the spare row decoder 3 to operate. When the defective memory cell is designated through such programming, the output of the spare row decoder designated corresponding to the main row containing the defective memory cell is high in level. Then, the spare row 5 applied with the high level output is selected. The output of the NOR gate 6 is low and the output of the inverter 7 is high. As a result, the main decoder 1 is in the non-select state.

The circuit arrangement of the redundancy circuit as shown in FIG. 1 is easily assembled into a bit configuration type memory device in which data is read out bit by bit. For assembling the redundancy circuit into a byte configuration type memory device in which data is read out byte by byte, the circuit must be designed so that a single or a plurality of the spare rows or columns is switched among a plurality of inputs and outputs. Such a configuration makes the circuit construction complicated, and further deteriorates the write and read out speed performance of the memory device. The byte-configuration-memory device may be modified so as to have a redundancy function, if the spare row or column is provided for each bit of one byte. Such an approach, however, requires a number of spare rows or columns which is equal to that of bits of one byte. For example, four spare rows or columns are required for four bits; eight spare rows or columns for eight bits. Such a circuit configuration requires a large chip area of the semiconductor memory device. The result is a reduction of the production yield in manufacturing the semiconductor memory devices.

SUMMARY OF THE INVENTION

Accordingly, an object of the present invention is to provide a redundancy circuit for a byte-configuration-type semiconductor memory device, which is simple in construction and requires a little increase of the chip area, and does not deteriorate the memory access speed performance.

According to the invention, there is provided a semiconductor memory device of the byte configuration type in which data is read out for each bit, comprising:

a main memory having a plurality of memory cells arrayed in a matrix fashion, said matrix array being divided into a plurality of main memory sections in the column direction;

a spare memory for saving defective memory cells contained in said main memory, the spare memory comprising spare rows of a plurality of spare memory cells arranged in the row direction, the spare row being provided for each of said main memory sections;

programmable spare row decoders provided for each row of said spare memory cells, and for independently selecting each row of said spare memory cells; and main-decoder-disable signal generating circuits provided for each of said memory sections and for placing all of the row main decoders of the corresponding memory section in a non-select state in response to a signal derived from the programmed spare row decoder of said corresponding memory section.

BRIEF DESCRIPTION OF THE DRAWINGS

FIG. 3 is a block diagram of a redundancy circuit for a semiconductor memory device, which is an embodiment of the present invention.

DETAILED DESCRIPTION OF THE PREFERRED EMBODIMENT

Figure 1:
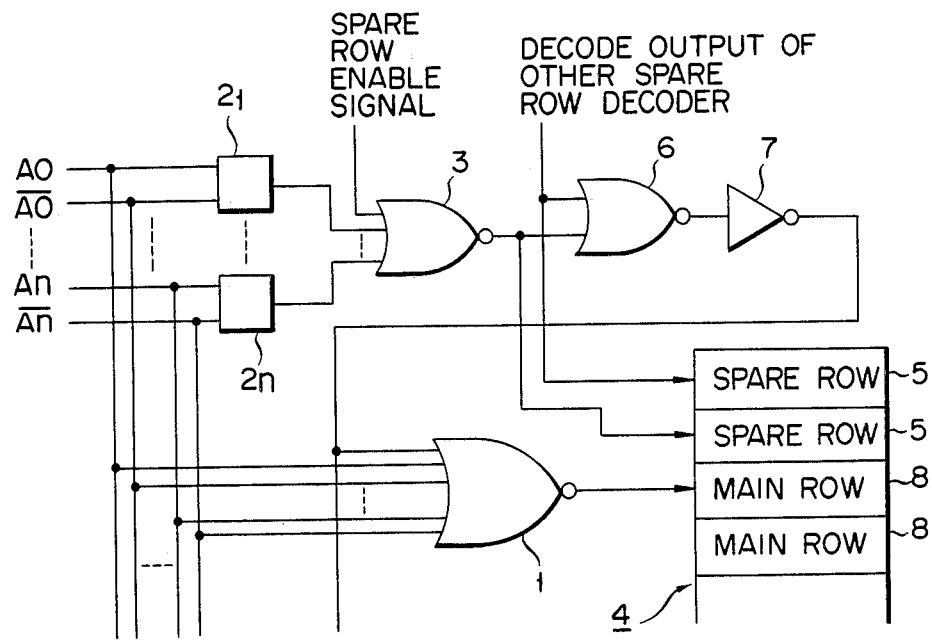
FIG. 1 shows a block diagram of a conventional redundancy circuit assembled into a semiconductor memory device.
Figure 2:
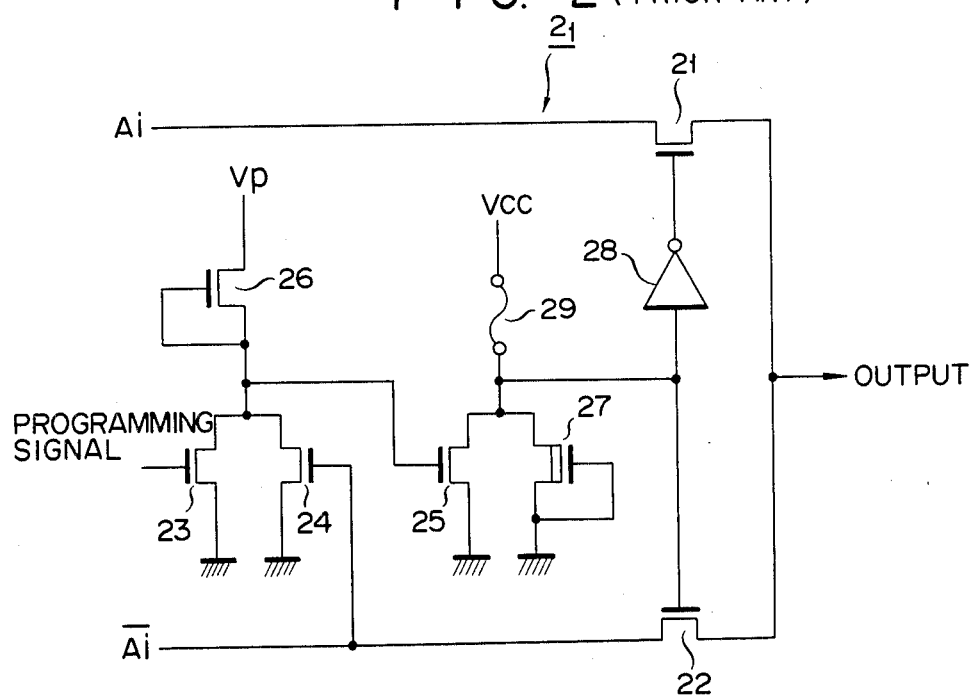
FIG. 2 shows a circuit diagram of a program circuit in the redundancy circuit shown in FIG. 1.

Reference is made to FIG. 3 illustrating an embodiment of a redundancy circuit of a semiconductor memory device according to the present invention. In the embodiment, the redundancy circuit according to the present invention is applied to a byte-configuration-type static random access memory (SRAM) of 8 Kilo words × 8 bits. As shown, the rows and columns of the memory matrix contain each 256 memory cells. The memory cell array comprises two sections 31 and 32 divided in the column direction. Each section 31 or 32 further consists of 8 units (16 column lines) each containing 4096 cells. The number of units is selected corresponding to 8 bits constituting one byte.

The sections 31 and 32 respectively contain main row decoders 33 and 34 located at the center thereof. The main row decoders 33 and 34 can each select a row, independently of the main memory in each of the cell sections 31 and 32. A column decoder 35 is commonly provided for all of the units. The column decoder 35 receives address signals Ao, $\overline{Ao}$ to A3, $\overline{A3}$, and decodes these signals to select one of 16 columns in each unit. The 8 bit lines of the section 31 or 32 which have been selected by the column decoder 35 are selected by transducer gates 39 and 40. The transfer gates 39 and 40 are gate controlled by the address signals A4 and $\overline{A4}$ derived from an address buffer 38.

In FIG. 3, only the transfer gates 39 and 40 for the fifth bit are illustrated for simplicity.

The memory cell sections 31 and 32 have pairs of spare rows 41 and 42, and 43 and 44, respectively. The spare rows 41, 42, 43 and 44 each comprise a plurality of spare cells arranged in the row direction. The main row decoders 33 and 34 receive the address signals A4 and $\overline{A4}$ from the buffer 38, thereby to select either of the memory cell sections 31 and 32. The decoders 33 and 34 receive the address signals, A5, $\overline{A5}$, to A12, $\overline{A12}$, thereby to select the main row. Spare row decoders 45, 46, 47 and 48 are for selecting spare rows 41–44. The spare row decoders 45 and 46 are selected by the address signal A4 from the address buffer 38 when the signal is logical "0." By signals A5, $\overline{A5}$ to A12, $\overline{A12}$, the spare rows 41 and 42 are selected according to the contents of the signals. Similarly, the decoders 47 and 48 are selected by the address signal of logical "0." The spare rows 43 and 44 are selected by the address signals A5, $\overline{A5}$ to A12, $\overline{A12}$. The output signals from the spare row decoders 45 and 46 are input to a main-decoder-disable-signal generation circuit 49. The outputs of the spare row decoders 47 and 48 are input to a main-decoder-disable-signal generation circuit 50. The output signal from the main-decoder-disable-signal generation circuit 49 is input to the main row decoder 33, and the output of the generation circuit 50 is input to the main row decoder 34.

Figure 4:
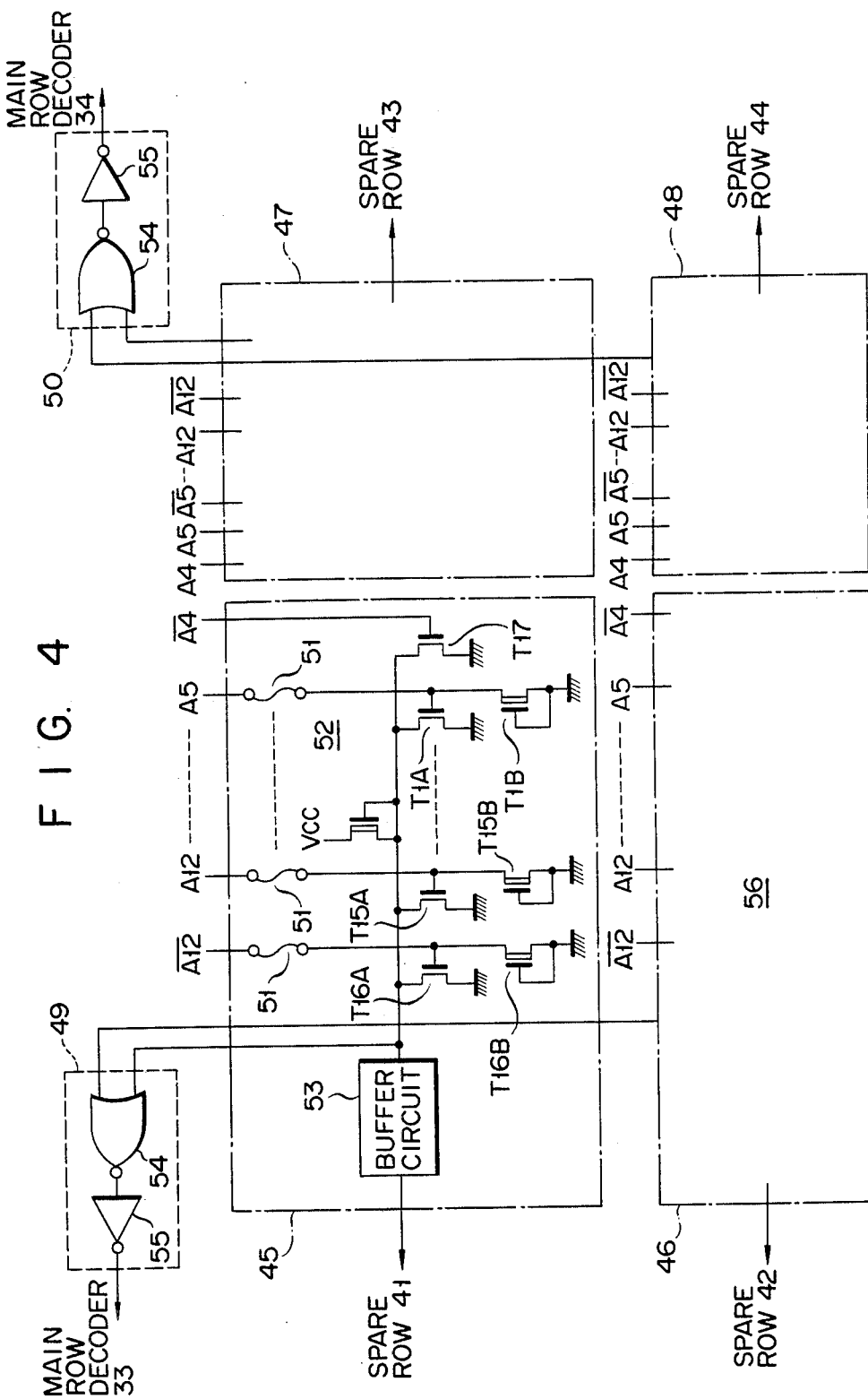
FIG. 4 is a circuit diagram of a portion of the redundancy circuit of FIG. 3.

FIG. 4 shows a portion of the circuit shown in FIG. 3, which includes the spare row decoders 45–48 and the generation circuits 49 and 50. Particularly, the spare row decoder 45 and the generation circuit 49 are illustrated in detail. The decoders 46–48 each have the same circuit arrangement as that of the decoder 45. The generation circuit 50 has the same circuit arrangement as that of the main-decoder-disable-signal generation circuit 49. The spare row decoder 45 contains a plurality of fuses 51 as program elements. The fuses 51 are burned out by applying a laser beam to them.

In the decoder transistor section 52 of the decoder 45, transistors T1A–T16A and T17 are all of the N channel enhancement type. The gates of those transistors T1A–T16A are connected to the first ends of fuses 51, respectively. The second ends of these fuses are connected to the address signals A5, $\overline{A5}$ to A12, $\overline{A12}$, respectively. The address signal $\overline{A4}$ is input to the gate of the transistor T17. The gates of the transistors T1A–T16A are grounded through N channel depletion type transistors T1B–T16B of which the gates and the sources are interconnected with each other. The current capacitance of each of the transistors T1A–T16A is several μA. The output of the decoder section 52 is input to the butter circuit 53. When the output signal of the decoder section 52 is logical "1," the spare row 41 is selected. The main-decoder-disable signal generation circuit 49 contains a NOR gate 54 coupled with the outputs of the decoder sections 52 and 56, and an inverter 55 which inverts in level the output signal of the NOR gate 54 and inputs it to the main row decoder 33.

The operation of the FIG. 4 circuit will be given.

When the spare row decoder 45, for example, is not programmed, that is, none of the fuses are burned out, the address signals A5, $\overline{A5}$ to A12, $\overline{A12}$ cause one of the transistors T1A–T16A to turn on. Then, the output of the decoder is low in level, and the spare row 41 is not selected. It is assumed now that the fuses 51 are selectively burned out, and the decoder 45 is programmed so that all of the transistors T1A–T16A and T17 are turned off by the address signals A5, $\overline{A5}$ to A12, $\overline{A12}$, and A4. If an address signal corresponding to the address programmed is input, the output of the decoder 45 is high in level, and the spare row 41 is selected.

The main-decoder-disable-signal generation circuit 49 is low in level at the output when the outputs of the spare row decoders 45 and 46 are both low in level. When the output signal of either of the decoders 45 and 46 is high, its output is high. This high level output is a disable signal for the main row decoder 33 and is applied to the gate of the driver transistor (not shown) in the decoder 33.

It is assumed that, in the memory device of FIG. 3, one defective memory cell is detected in the memory section 31. In this case, the address of the row containing the defective memory cell is programmed for the spare row decoder 45, for example. This programming is made in such a manner that the programming fuses of the decoder 45 are selectively burned out corresponding to the address of the row. With such a programming, when the main row containing the defective memory cell is designated, the spare decoder 45 corresponding to the main row is selected and the output of the decoder 45 is high in level. Then, the output signal of the main-decoder-disable-signal generation circuit 49 is at a high level or a disable level. All of the main row decoders in the memory section 31 are in a non-select condition. In other words, the main row decoder is not selected, and only the spare row decoder 45 is selected. This indicates that the main row containing the defective memory cell is replaced with the spare row 41 by the decoder 45. If the memory section 31 contains another main row containing a defective memory cell, the spare row decoder 46 is programmed corresponding to an address of the other row, as in the case of the decoder 45, and then the defective cell contained main row is replaced by the spare row 42. This is correspondingly applied for the memory section 31. Also in the memory section 32, the spare row decoders 47 and 48 are appropriately programmed and the two main rows containing the defective memory cells are replaced by the spare rows 43 and 44.

As seen from the foregoing description, in the redundancy circuit according to the embodiment of the present invention, two main rows containing the defective memory cells can be saved in each of the memory sections 31 and 32. Therefore, a total of four main rows containing the defective memory cells can be saved in both the memory sections 31 and 32. The number of the saved rows is two times that of the conventional redundancy circuit in which the spare rows are provided for a single memory array, not separated into two sections. The arrangement of the embodiment of the present invention in which the memory array is divided into two sections, and each of the memory sections is associated with the spare rows, is equivalent to an arrangement in which each memory section is associated with both the spare row and column. As for the defective cell saving effect, the arrangement of the present invention is inferior to the conventional arrangement in which the spare row is provided for each bit of the byte. However, the circuit arrangement is simpler than that of the conventional one. Thus, the increase of the chip area is minimized. Further, there is no need for switching the spare rows among a plurality of input and output terminals. Therefore, access time to the memory is not affected.

In the decoders 45 to 48, the fuses are burned out by a laser beam, but may alternately be burned out electrically, viz., by feeding current thereinto, if necessary.

Further, the memory array may be divided into two or more sections, if necessary. However, when the number of the divided sections is increased, the number of the row decoders is correspondingly increased. In this respect, it is not recommended to use three or more divided memory sections. The division of the two sections as in the above-mentioned embodiment provides a satisfactory effect in practical use, and is simple in construction.

Additionally, it is evident that the present invention is applicable not only for SRAMs, but also for DRAMs and PROMs.

What is claimed is:

1. A semiconductor memory device, comprising:
    a main memory having a plurality of main memory cells arranged in a matrix array of rows and columns, said matrix array being divided in the column direction into a plurality of main memory sections;
    a plurality of spare memory means, each of said spare memory means individually corresponding to a respective one of said main memory sections, for replacing defective memory cells contained in said main memory sections, said spare memory means each comprising a plurality of spare memory cells arranged in rows;
    a plurality of programmable spare row decoder means for selecting said spare memory means, each of said spare row decoder means individually selecting a respective one of said rows of spare memory cells; and
    a plurality of means for disabling said main memory sections in response to a signal from said programmable spare row decoder means, each of said disabling means individually corresponding to one of said main memory sections.

2. A semiconductor memory device according to claim 1, comprising two main memory sections.

* * * * *